US008589848B2

(12) United States Patent
Alpert et al.

(10) Patent No.: US 8,589,848 B2
(45) Date of Patent: Nov. 19, 2013

(54) DATAPATH PLACEMENT USING TIERED ASSIGNMENT

(75) Inventors: Charles J. Alpert, Austin, TX (US);
Zhuo Li, Cedar Park, TX (US);
Natarajan Viswanathan, Austin, TX (US); Samuel I. Ward, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/451,382

(22) Filed: Apr. 19, 2012

(65) Prior Publication Data
US 2013/0283225 A1 Oct. 24, 2013

(51) Int. Cl.
*G06F 17/50* (2006.01)
(52) U.S. Cl.
USPC ............................................. 716/118
(58) Field of Classification Search
USPC .................................. 716/100, 118
See application file for complete search history.

(56) References Cited

U.S. PATENT DOCUMENTS

| 5,657,243 | A | 8/1997 | Toyonaga et al. |
| 5,838,583 | A | 11/1998 | Varadarajan et al. |
| 5,930,499 | A | 7/1999 | Chen et al. |
| 6,594,808 | B1 | 7/2003 | Kale et al. |
| 6,598,215 | B2 | 7/2003 | Das et al. |
| 6,889,275 | B2 * | 5/2005 | Vandecappelle et al. ..... 710/107 |
| 7,546,567 | B2 * | 6/2009 | Cheon et al. .................. 716/113 |
| 2003/0041128 | A1 * | 2/2003 | Vandecappelle et al. ..... 709/220 |
| 2006/0053396 | A1 * | 3/2006 | Eng ................................. 716/7 |
| 2009/0031269 | A1 | 1/2009 | Chen et al. |

OTHER PUBLICATIONS

Ienne, Paolo et al., "Practical Experiences with Standard-Cell Based Datapath Design Tools", Proc. 1998 Design Automation Conference, pp. 396-401 (1998).
Ono, Satoshi et al., "On Structure and Suboptimality in Placement", Proc. of the 2005 Asia and South Pacific Design Automation Conference, pp. 331-336 (2005).
Ward, Samuel et al., "Quantifying Academic Placer Performance on Custom Designs", Proc. of the 2011 International Symposium on Physical Design, pp. 91-98 (Mar. 2011).
Ward, Samuel et al., "Keep it Straight: Teaching Placement how to Better Handle Designs with Datapaths", Proc. of the 2012 ACM Int'l Symposium on Physical Design (Mar. 2012).

* cited by examiner

*Primary Examiner* — Suchin Parihar
(74) *Attorney, Agent, or Firm* — Matthew W. Baca; Jack V. Musgrove

(57) ABSTRACT

Datapath placement defines tiers for placement sets of a cell cluster, assigns cells to the tiers constrained by the datapath width, and then orders cells within each tier. Clusters are identified using machine-learning based datapath extraction. Datapath width is determined by computing a size of a bounding box for cells in the cluster. Placement sets are identified using a breadth-first search beginning with input cells for the cluster. Tiers are initially defined using logic depth assignment. A cell may be assigned to a tier by pulling the cell from the next higher tier to fill an empty location or by pushing an excess cell into the next higher tier. Cells are ordered within each tier using greedy cell assignment according to a wire-length cost function. The datapath placement can be part of an iterative process which applies spreading constraints to the cluster based on computed congestion information.

25 Claims, 5 Drawing Sheets

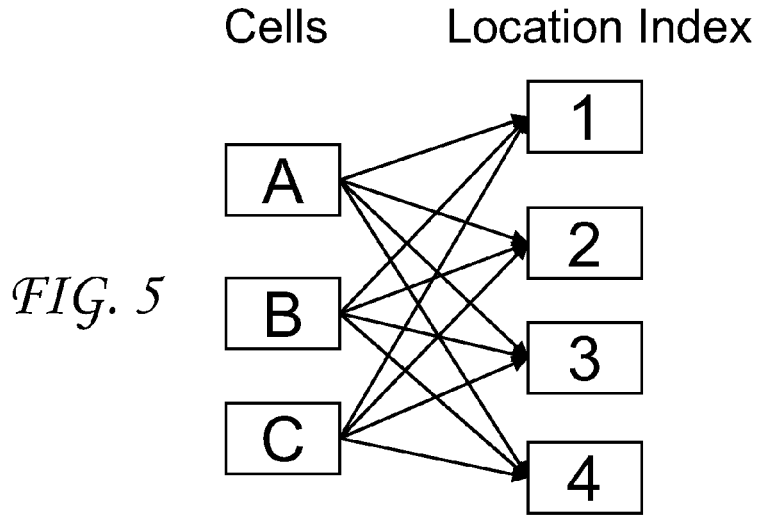
FIG. 5
| Cost | 1 | 2 | 3 | 4 |
|---|---|---|---|---|
| A | 10 | 10 | ~~12~~ | ~~14~~ |
| B | ~~12~~ | 10 | 10 | ~~12~~ |
| C | ~~14~~ | ~~12~~ | 10 | 10 |
FIG. 6
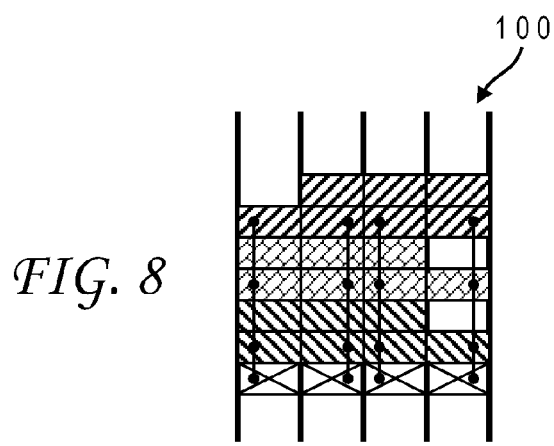
FIG. 8

DATAPATH PLACEMENT USING TIERED ASSIGNMENT

BACKGROUND OF THE INVENTION

1. Field of the Invention

The present invention generally relates to the design of semiconductor chips and integrated circuits, and more particularly to a method of placing components of an integrated circuit design in a layout.

2. Description of the Related Art

Integrated circuits are used for a wide variety of electronic applications, from simple devices such as wristwatches, to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements combined to perform a logic function. Cell types include, for example, core cells, scan cells, input/output (I/O) cells, and memory (storage) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers of conducting media available for routing, such as a polysilicon layer and three metal layers (metal-1, metal-2, and metal-3). The polysilicon layer, metal-1, metal-2, and metal-3 are all used for vertical and/or horizontal routing.

An IC chip is fabricated by first conceiving the logical circuit description, and then converting that logical description into a physical description, or geometric layout. This process is usually carried out using a "netlist," which is a record of all of the nets, or interconnections, between the cell pins, including information about the various components such as transistors, resistors and capacitors. A layout typically consists of a set of planar geometric shapes in several layers. The layout is then checked to ensure that it meets all of the design requirements, particularly timing requirements. The result is a set of design files known as an intermediate form that describes the layout. The design files are then run through a dataprep process that is used to produce patterns called masks by an optical or electron beam pattern generator. During fabrication, these masks are used to etch or deposit features in a silicon wafer in a sequence of photolithographic steps using a complex lens system that shrinks the mask image. The process of converting the specifications of an electrical circuit into such a layout is called the physical design.

Cell placement in semiconductor fabrication involves a determination of where particular cells should optimally (or near-optimally) be located on the surface of a integrated circuit device. Due to the large number of components and the details required by the fabrication process for very large scale integrated (VLSI) devices, physical design is not practical without the aid of computers. As a result, most phases of physical design extensively use computer-aided design (CAD) tools, and many phases have already been partially or fully automated. Automation of the physical design process has increased the level of integration, reduced turn around time and enhanced chip performance. Several different programming languages have been created for electronic design automation (EDA), including Verilog, VHDL and TDML. A typical EDA system receives one or more high level behavioral descriptions of an IC device, and translates this high level design language description into netlists of various levels of abstraction. Given a netlist $N=(V, E)$ with nodes (vertices) V and nets (edges) E, a global placement tool obtains locations $(x_i, y_i)$ for all the movable nodes, such that the area of nodes within any rectangular region does not exceed the area of cell sites in that region. Though some work has looked at general Steiner wirelength optimization, placers typically minimize the half-perimeter wirelength (HPWL) of the design. Modern placers often approximate HPWL by a differentiable function using a quadratic objective.

Physical synthesis is prominent in the automated design of integrated circuits such as high performance processors and application specific integrated circuits (ASICs). Physical synthesis is the process of concurrently optimizing placement, timing, power consumption, crosstalk effects and the like in an integrated circuit design. This comprehensive approach helps to eliminate iterations between circuit analysis and place-and-route. Physical synthesis has the ability to repower gates (changing their sizes), insert repeaters (buffers or inverters), clone gates or other combinational logic, etc., so the area of logic in the design remains fluid. However, physical synthesis can take days to complete, and the computational requirements are increasing as designs are ever larger and more gates need to be placed. There are also more chances for bad placements due to limited area resources.

SUMMARY OF THE INVENTION

The present invention is generally directed to a method of placing cells in a layout for an integrated circuit design by receiving a circuit description for the integrated circuit design which includes a plurality of cells interconnected to form a plurality of nets, the cells having locations from a previous placement, identifying at least one cluster of the cells forming datapath logic, determining a datapath width for the cluster, identifying at least one placement set of cells in the cluster, defining a plurality of tiers in the placement set based on connectivity of the cells in the placement set, selectively assigning the cells in the placement set to the tiers constrained by the datapath width, and then ordering cells within each tier. The cluster may be identified using machine-learning based datapath extraction wherein candidate clusters from the circuit description are evaluated to mark specific characteristics used to generate cluster features, and the candidate clusters are classified as either datapath logic or random logic using training models which include the features. The datapath width may be determined by computing a size of a bounding box for cells in the cluster according to locations of the cells in the previous placement. The placement set may be identified using a breadth-first search beginning with input cells for the cluster. The number of tiers may be initially defined using logic depth assignment of cells in the placement set. A cell may be assigned to a tier by pulling the cell from a next higher tier into a current tier to fill an empty location in the current tier, provided the cell has a greatest number of interconnections with the current tier among all cells in the next higher tier. The cells may be ordered within each tier using greedy cell assignment according to a wirelength cost function based on locations of the cells in the previous placement. After ordering the cells in all the tiers, congestion information may be computed and spreading constraints applied to cells in the cluster, and the datapath placement process can repeat iteratively until the congestion target is reached.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

FIG. 5 is a tier assignment graph for a simplified example having 3 cells to be placed in a tier having four rows, in accordance with one implementation of the present invention;

FIG. 6 is a cost table for different cell locations based on the example of FIG. 5 generated in accordance with one implementation of the present invention;

FIG. 8 is a plan view of a layout for the circuit structure of FIG. 1 generated in accordance with one implementation of the present invention.

The use of the same reference symbols in different drawings indicates similar or identical items.

DESCRIPTION OF THE PREFERRED EMBODIMENT(S)

As technology scales beyond the deep-submicron regime and operating frequencies increase, a new style is emerging in the design of integrated circuits (semiconductor devices) referred to as hybrid designs, which contain a mixture of random logic and datapath standard cell components. Unfortunately, conventional HPWL-driven placers generally under-perform in terms of regularity and Steiner wirelength for such hybrid designs, and the quality gap between manual placement and automatic placers is more pronounced as the designs become more datapath-oriented.

Formulation for datapath logic is very different than that for random logic. Random logic placers ignore this aspect of hybrid designs, which can lead to major congestion issues with state-of-the-art devices. This problem may be understood with reference to the exemplary circuit structure 2 seen in FIG. 1. Circuit structure 2 includes four datapaths from four inputs to the datapath cluster as indicated by the vertical lines. Current automated placement tools would generate a layout 4 similar to that seen in FIG. 2 for circuit structure 2 in an attempt to primarily minimize wirelength. The result is poor datapath alignment. The associated problems with wirelength and congestion can be further exacerbated by features which may disrupt the circuit structure. These features for example may include output gate positions, high fanout nets, and spreading for congestion.

In light of the foregoing, it would be desirable to devise an improved method of placing datapath logic in designs having both datapath and random logic, to facilitate datapath alignment. It would be further advantageous if the method could also mitigate congestion issues. Conventional placers cannot take into account datapath styles that are not perfect "bit-stack" structures. The present invention overcomes this limitation of the prior art by providing a mechanism to control the datapath structure and thereby improve alignment (resulting in better wirelength). The present invention may further be used to improve congestion through directed spreading.

Figure 3:
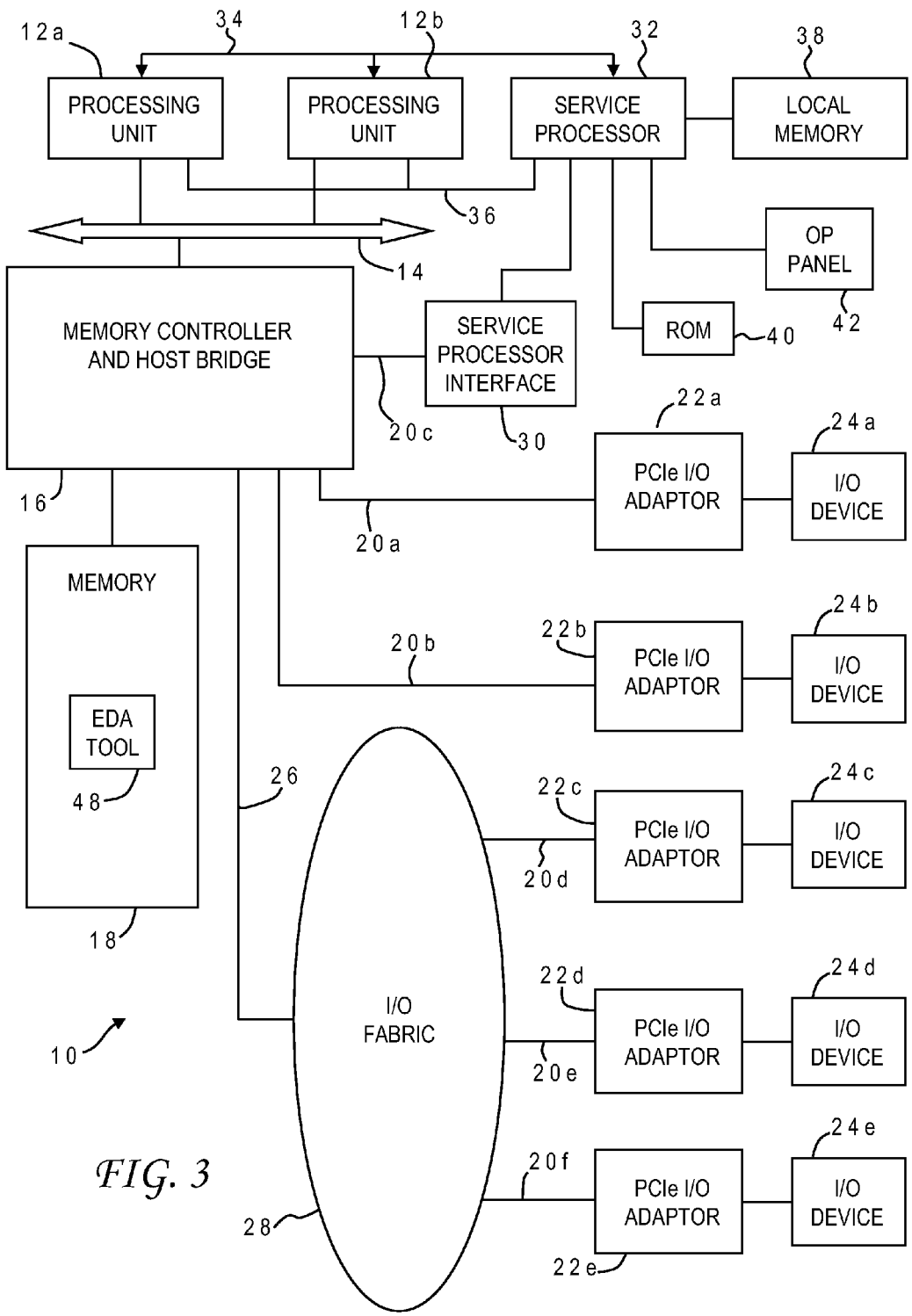
FIG. 3 is a block diagram of a computer system programmed to carry out integrated circuit design placement in accordance with one implementation of the present invention.

With reference now to the figures, and in particular with reference to FIG. 3, there is depicted one embodiment 10 of a computer system in which the present invention may be implemented to carry out the placement of logic structures in an integrated circuit design. Computer system 10 is a symmetric multiprocessor (SMP) system having a plurality of processors 12a, 12b connected to a system bus 14. System bus 14 is further connected to a combined memory controller/host bridge (MC/HB) 16 which provides an interface to system memory 18. System memory 18 may be a local memory device or alternatively may include a plurality of distributed memory devices, preferably dynamic random-access memory (DRAM). There may be additional structures in the memory hierarchy which are not depicted, such as on-board (L1) and second-level (L2) or third-level (L3) caches.

MC/HB 16 also has an interface to peripheral component interconnect (PCI) Express links 20a, 20b, 20c. Each PCI Express (PCIe) link 20a, 20b is connected to a respective PCIe adaptor 22a, 22b, and each PCIe adaptor 22a, 22b is connected to a respective input/output (I/O) device 24a, 24b. MC/HB 16 may additionally have an interface to an I/O bus 26 which is connected to a switch (I/O fabric) 28. Switch 28 provides a fan-out for the I/O bus to a plurality of PCI links 20d, 20e, 20f. These PCI links are connected to more PCIe adaptors 22c, 22d, 22e which in turn support more I/O devices 24c, 24d, 24e. The I/O devices may include, without limitation, a keyboard, a graphical pointing device (mouse), a microphone, a display device, speakers, a permanent storage device (hard disk drive) or an array of such storage devices, an optical disk drive, and a network card. Each PCIe adaptor provides an interface between the PCI link and the respective I/O device. MC/HB 16 provides a low latency path through which processors 12a, 12b may access PCI devices mapped anywhere within bus memory or I/O address spaces. MC/HB 16 further provides a high bandwidth path to allow the PCI devices to access memory 18. Switch 28 may provide peer-to-peer communications between different endpoints and this data traffic does not need to be forwarded to MC/HB 16 if it does not involve cache-coherent memory transfers. Switch 28 is shown as a separate logical component but it could be integrated into MC/HB 16.

In this embodiment, PCI link 20c connects MC/HB 16 to a service processor interface 30 to allow communications between I/O device 24a and a service processor 32. Service processor 32 is connected to processors 12a, 12b via a JTAG interface 34, and uses an attention line 36 which interrupts the operation of processors 12a, 12b. Service processor 32 may have its own local memory 38, and is connected to read-only memory (ROM) 40 which stores various program instructions for system startup. Service processor 32 may also have access to a hardware operator panel 42 to provide system status and diagnostic information.

In alternative embodiments computer system 10 may include modifications of these hardware components or their interconnections, or additional components, so the depicted example should not be construed as implying any architectural limitations with respect to the present invention. The invention may further be implemented in an equivalent cloud computing network.

When computer system 10 is initially powered up, service processor 32 uses JTAG interface 34 to interrogate the system (host) processors 12a, 12b and MC/HB 16. After completing the interrogation, service processor 32 acquires an inventory and topology for computer system 10. Service processor 32 then executes various tests such as built-in-self-tests (BISTs), basic assurance tests (BATs), and memory tests on the components of computer system 10. Any error information for failures detected during the testing is reported by service processor 32 to operator panel 42. If a valid configuration of system resources is still possible after taking out any components found to be faulty during the testing then computer system 10 is allowed to proceed. Executable code is loaded into memory 18 and service processor 32 releases host processors 12a, 12b for execution of the program code, e.g., an operating system (OS) which is used to launch applications and in particular the circuit design application of the present invention (EDA tool 48), results of which may be stored in a hard disk drive of the system (an I/O device 24). While host processors 12a, 12b are executing program code, service processor 32 may enter a mode of monitoring and reporting any operating parameters or errors, such as the cooling fan speed and operation, thermal sensors, power supply regulators, and recoverable and non-recoverable errors reported by any of processors 12a, 12b, memory 18, and MC/HB 16. Service processor 32 may take further action based on the type of errors or defined thresholds.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable media may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. The computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this invention, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, written for a variety of platforms such as an AIX environment or operating systems such as Windows 7 or Linux. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks. Such storage media excludes transitory media.

The computer program instructions may further be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Computer system 10 carries out program instructions for an integrated circuit design process that uses novel placement techniques to optimize datapath alignment for the design. Accordingly, a program embodying the invention may include conventional aspects of various placement tools, and these details will become apparent to those skilled in the art upon reference to this disclosure.

Referring now to FIGS. 4A-4D, there is depicted a circuit structure comprising a placement set 50 of gates or cells which are to be placed in a layout for an integrated circuit design which has already undergone global placement. Placement set 50 includes six input cells (primary inputs, or outputs of upstream logic) which fan out to thirteen internal cells. In the illustrative implementation of the present invention, a placement set represents highly-connected datapath cells which are to be placed together as a unit. In the specific example of FIGS. 4A-4D, placement set 50 is a basic OR tree, but those skilled in the art will understand that the invention is generally applicable to any datapath structure.

Placement set 50 may be part of a larger group of cells such as a cell cluster. The cell cluster may include multiple placement sets all having common input cells, but internal cells within a given placement set will not be interconnected with internal cells in any other placement set. An entire cluster may further constitute a placement set, i.e., a cluster may have only one placement set. Multiple placement sets within a single cluster may be similar or identical in structure. For example, the circuit structure 2 seen in FIG. 1 may be considered a cell cluster having three placement sets based on the three identical sub-structures which all receive the same four inputs. A given circuit design may have a multitude of different cell clusters. Clusters and placement sets may be computed as discussed further below, or may be manually identified in the netlist provided to an EDA tool 48 programmed in accordance with the present invention and running on computer system 10.

EDA tool 48 can assign internal cells of a placement set to different tiers of a physical layout based on the cells' connectivity in accordance with the illustrative implementation of the present invention. The number of locations available for a cell in a tier is equal to the width of the datapath which can be manually set or computed according to a variety of methods. The datapath width is the number of rows allocated to the placement set layout, wherein the rows are parallel with the general datapath direction (which is vertical for the examples depicted in the figures, although a circuit could be laid out with a different orientation leading to horizontal datapaths).

The simplest approach to determining datapath width is to use the global placement bounding box for the cluster, which takes into account any fixed blockages (width simply equal to bounding box width). Alternatively, the fanout net size can be used (width equal to the greater of the number of inputs or the number of outputs for the cluster). As a further alternative, divisive or agglomerative hierarchical clustering may be used. For divisive clustering all of the observations are assigned to a single cluster which is partitioned into two least similar clusters. Partitioning continues recursively on each cluster until there is one cluster for each observation. In agglomerative clustering each observation is assigned to its own cluster. Similarity (e.g., distance) is computed between each of the clusters and the two most similar clusters are joined. These steps are repeated until there is only a single cluster left.

Figure 4A:
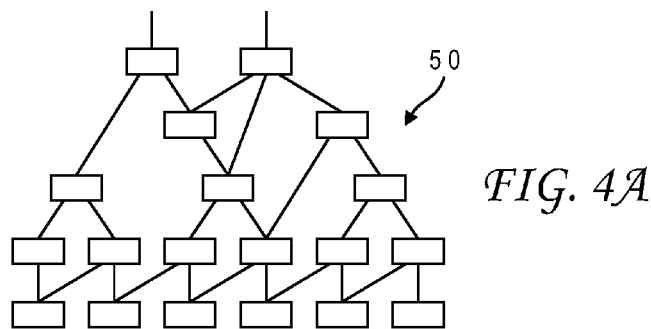
FIGS. 4A-4D are pictorial representations of a circuit structure (or a placement set for a larger circuit structure) which is divided into multiple placement tiers in accordance with one implementation of the present invention.
Figure 4B:
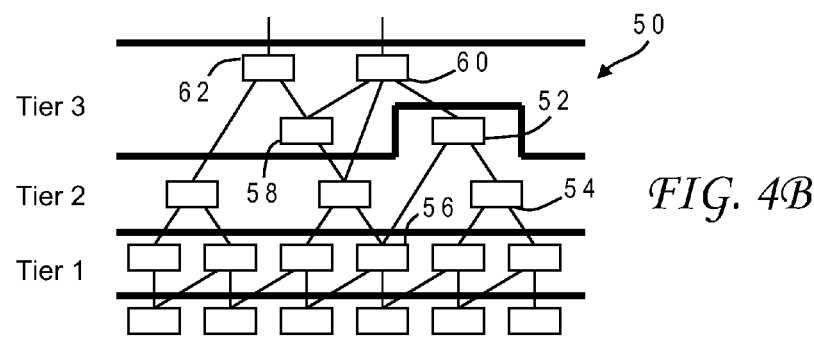

Once the datapath width for the cluster has been determined, EDA tool 48 running on computer system 10 proceeds to consider the number of tiers to be used for a given placement set. The initial number of tiers is preferably based on the internal cell connectivity, i.e., the number of logic levels starting from the input cells (logic depth assignment). As seen in FIG. 4B, the set of six internal cells having connections to the input cells constitute the first logic level of the placement set and thus the first tier. There are three cells having inputs from only the first tier, so those three cells are included in the second tier, but the second tier also includes cell 52 because cell 52 receives an input from cell 56 which is in the first tier even though cell 52 also receives an input from cell 54 which is in the second tier. This logic depth assignment leaves cells 58, 60 and 62 in the third tier.

Figure 4C:
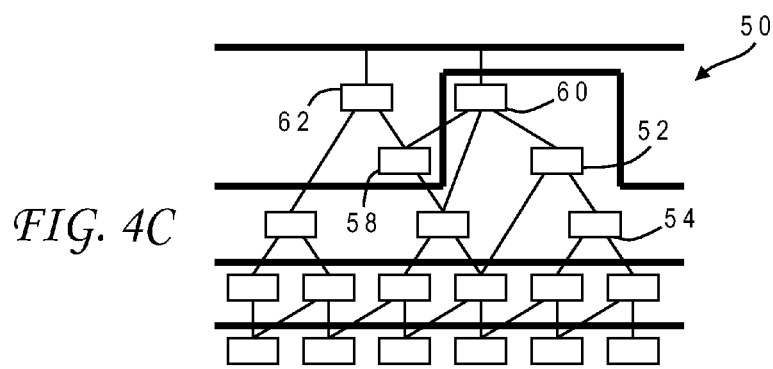
Figure 4D:
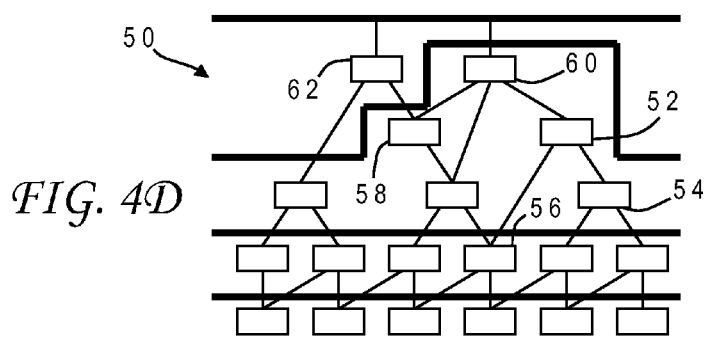

The initial assignment of cells to tiers shown in FIG. 4B is preliminary and may result in a tier having fewer cells than the cluster width (empty locations) or having more cells than the cluster width (excess usage). Accordingly, EDA tool 48 can start at the lowest tier (tier 1) and walk forward through each tier, pushing cells out of the current tier or pulling them into the current tier as necessary according to the density limit, using a "greedy" cell assignment. The preliminary cell-tier assignment depicted in FIG. 4B has six cells assigned to tier 1, and the datapath width for the corresponding cluster has been determined for this example to also be six, so tier 1 is full, i.e., no empty locations or excess usage. The assignment procedure thus proceeds to tier 2 which has only four cells currently assigned, leaving two empty locations. When an empty location is encountered, the cell in the next higher tier having the greatest number of interconnections with the current tier is pulled into the current tier. For this example, any of cells 58, 60 or 62 might be pulled from tier 3 into tier 2, but cell 60 has two interconnections with cells currently assigned to tier 2 while cells 58 and 62 have only one interconnection with tier 2. Cell 60 is accordingly pulled into tier 2 as seen in FIG. 4C, but there is still one empty location in tier 2. At this point either cell 58 or 62 may be pulled into tier 2 since both of those cells have the same number of interconnections with tier 2. Alternatively, EDA tool may further refine the placement optimization by considering other factors such as timing-awareness or congestion. In this example assignment of cell 62 to tier 2 would result in worse timing so cell 58 is instead assigned as illustrated in FIG. 4D. This is the final cell-tier assignment as tier 3 now has only one cell remaining and there are no cells in higher tiers to pull into tier 3. Cells are never pulled into the current placement set from other placements sets, and cells are never pushed outside of the current placement set.

As an alternative to the foregoing, K-means clustering may be performed on the placement set to determine the number of tiers and cell assignment to each tier. The number of tiers may be computed as the number of cells divided by the width, rounded up. K-means clustering is a known method of cluster analysis which partitions a data space into Voronoi cells. Each observation (cell) is assigned to a cluster (tier) having the closest mean according to the Voronoi diagram. These techniques are not exclusive and those skilled in the art may favor other methods for optimizing cell-tier assignment.

Once cells have been assigned to tiers, their placement may be further optimized by ordering cells within a tier. Cell ordering may likewise be accomplished according to a variety of methods. In the illustrative implementation cells are ordered within a tier using a distance cost function based on previous cell locations as depicted in FIGS. 5 and 6. FIG. 5 shows a graph of three cells A, B, C which are to be assigned to four locations indexed 1-4. FIG. 6 shows the corresponding cost for placing each cell A, B, C in a given one of the location indices 1-4. Wirelength cost may be computed in various ways that will become apparent to those skilled in the art. In the preferred embodiment, Steiner wirelength is used. Vertical cost is constant per tier (the height of the tier), and horizontal cost is the sum of distances from other connected cells.

EDA tool 48 can first remove all non-optimal edges from the cell ordering graph, and then see if the min-cover of the graph is greater than or equal to the number of cells present. A min-cover, or vertex cover, is a known feature of graph theory. If the min-cover of the cell ordering graph is greater than or equal to the number of cells present, there is an optimal assignment to achieve minimum cost that can be determined using any greedy algorithm.

If the min-cover of the graph is less than the number of cells, it is still feasible to find groups of cells with optimal assignments within each group, independent of other cells. In such a case, any optimal cells and their locations are first removed to form a new graph, and the remaining cells are then grouped into different spatial categories. In the illustrative implementation there are three categories: left-optimal cells, center-optimal cells, and right-optimal cells. Left-optimal cells are those cells for which the cost is lowest at the left of the tier, with cost increasing as the cell moves to the right. Center-optimal cells are those cells for which the cost is lowest at the middle of the tier, with cost increasing as the cells moves left or right. Right-optimal cells are those cells for which the cost is lowest at the right of the tier, with cost increasing as the cells moves left. Other implementations could have more or fewer than three categories. EDA tool 48 can begin with either the left-optimal group or the right-optimal group, and work toward the other end. For example, if EDA tool 48 begins with the left-optimal group then it will move to the center-optimal group next and finally to the right-optimal group. When considering the left-optimal group having a number of cells K, EDA tool 48 will allocate a number K of the leftmost locations in the current graph, and sort the cells within these locations according to non-increasing wirelength constant number. In other words, the cell in the left-optimal group having the greatest cost will be placed first (leftmost) in the allocated locations, and the cell with the next greatest cost will be placed second, and so on. The same theory of operation applies to the center-optimal group and to the right-optimal group.

The tier-based datapath placement of the present invention can be further enhanced to facilitate routing by using an iterative process employing directed spreading. After cell ordering in all of the tiers is complete, congestion information can be computed (e.g., counting usable tracks remaining), and loaded into a global routing tool (which may be included with or separate from EDA tool 48). According to this iterative process, cells are placed using tiered assignment, congestion is estimated, and a spreading operation is performed. Congestion can be relieved by adjusting tier spacing or cluster width to generate a more compact placement that is still wirable. These three steps (place, estimate congestion, spread) are repeated until the congestion goal is reached.

Figure 7:
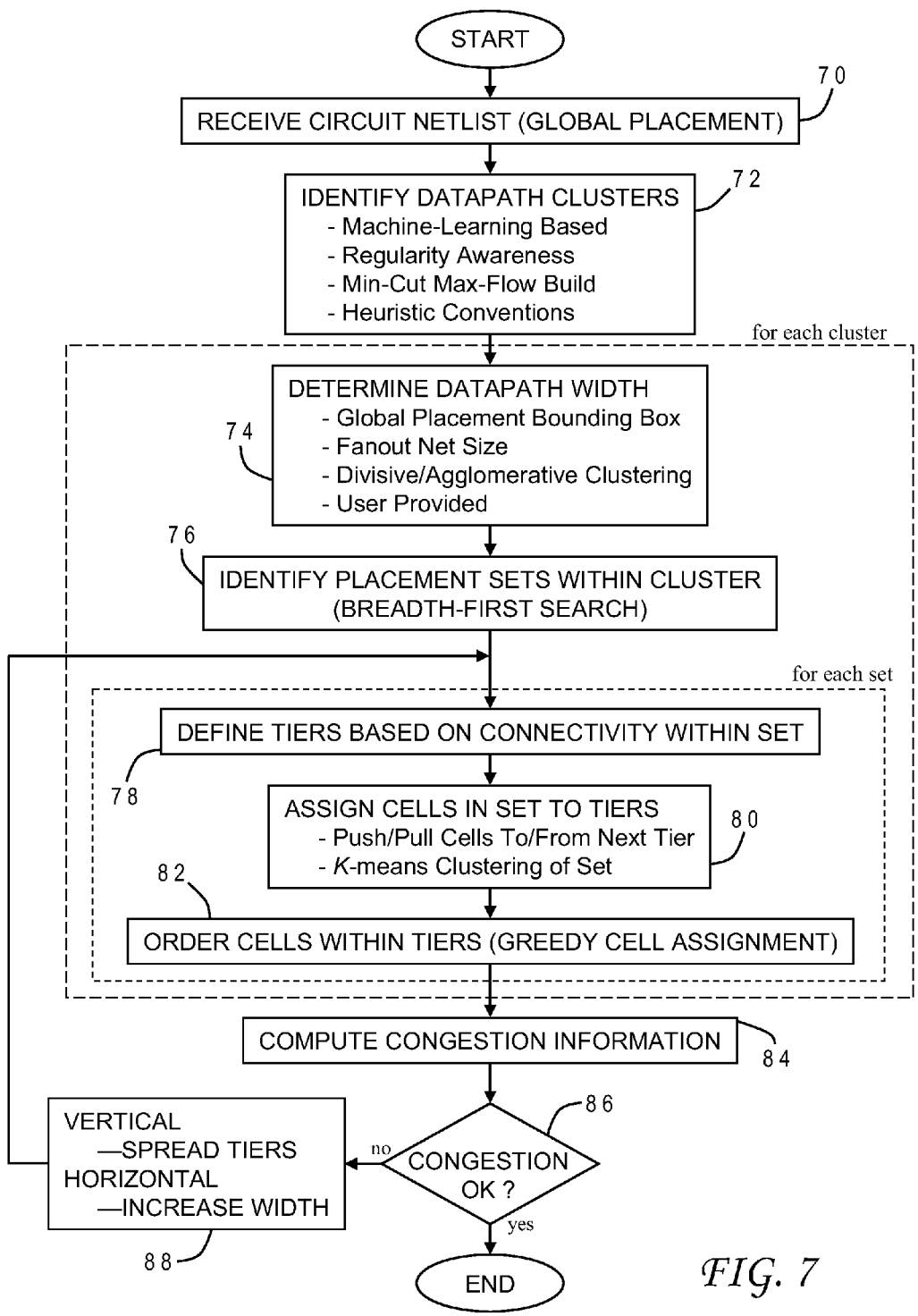
FIG. 7 is a chart illustrating the logical flow for a datapath placement process in accordance with one implementation of the present invention.

The invention may be further understood with reference to the chart of FIG. 7 which illustrates the logical flow for a datapath placement process carried out by EDA tool 48 running on computer system 10 in accordance with one implementation. The process begins when the program receives the circuit description or netlist for the integrated circuit design or portion thereof to be placed (70). The netlist may be the product of a previous global placement. EDA tool 48 first identifies datapath clusters in the design (72). Identification of datapath clusters may be accomplished using a variety of techniques including prior art methods such as regularity aware extraction, min-cut max-flow build, or heuristic conventions. Regularity aware extraction uses basic logic "regularity" metrics to compare logic gates to each other. If they are sufficiently similar then the logic is marked as datapath, otherwise it is classified as random logic. This method searches for the datapath logic around high fanout nets (such as select lines) and gradually grows in a wave adding more cells. The min-cut, max flow build method creates bit-stack candidates, and looks between specific PI/PO pins or latches (or uses latch names). Heuristic conventions are the most widely used methods. They involve the designer providing specific net names or providing labels to the datapath logic so the design tools know where the datapath logic is. However, in the preferred implementation, datapath clusters are identified using a novel machine-learning based datapath extraction. According to this method, candidate clusters of the original netlist are generated in which to search for datapath structures based on connectivity. A seed growth approach may be used which maximizes the ratio of the external to internal force of a candidate cluster, while maintaining a maximum logic depth threshold. The external force is defined as the summation of the edge weights of nets with at least one vertex outside and one inside the cluster, and the internal force is defined as the summation of all internal cluster weight connections. Each candidate cluster is then evaluated to mark specific characteristics used to identify datapath logic and generate cluster features. For example, datapath logic often contains a high degree of graph automorphism. An automorphism of a graph (a form of symmetry) preserves the edge-vertex connectivity of the graph while mapping onto itself. Other physical features may be extracted to help characterize each candidate cluster. Dense clusters indicate tightly packed logic and possibly the need for improved placement whereas sparse logic is generally less likely to improve from being passed to a datapath placer. State-of-the-art machine-learning techniques can then be used to classify the clusters by training models for both datapath and random logic.

Once the datapath clusters have been identified, each cluster is separately analyzed beginning with a determination of its datapath width (74). As previously explained, various methods may be used including basing the width on the global placement bounding box, the fanout net size, divisive or agglomerative clustering, or a user input. Placements sets for a cluster are further identified (76), preferably using a breadth-first search beginning with the input cells for the cluster (primary inputs, or outputs of upstream logic). A breadth-first search is a search algorithm commonly used for traversing a tree structure or graph. The search begins at the root node and explores all neighboring nodes until the goal of the search is reached. Other approaches may be used including depth-first searching but this would require a different logic flow.

Once the placement sets for a cluster have been identified, each placement set is separately analyzed beginning by defining tiers for the placement set (78). As previously explained the tiers can be based on connectivity of cells with the placement set (logic depth). Cells in the placement set are then assigned to the tiers (80), such as by pulling cells from the next higher tier to fill empty locations in the current tier, and pushing any excess cells from the current tier to the next higher tier (or using K-means clustering). EDA tool 48 can thereafter order cells within the tiers such as by using a greedy cell assignment method (82). After cell placement is complete, congestion information may be computed (84) and compared to an acceptable congestion target (86). Different congestion metrics may be used, for example, the number of overflow nets, defined as the number of nets having a congestion greater than some percentage such as 100%, 90%, etc. If the vertical congestion is unacceptable the tier spacing can be increased, and if the horizontal congestion is unacceptable the cluster widths can be increased (88). While the actual width of the cluster in the physical layout is increased the width, EDA tool still uses the previous width value as the maximum number of cells that can be assigned to a tier. If the congestion meets the target then the process ends. Other termination criteria for this congestion/spreading loop may apply such as a maximum number of iterations.

Figure 1:
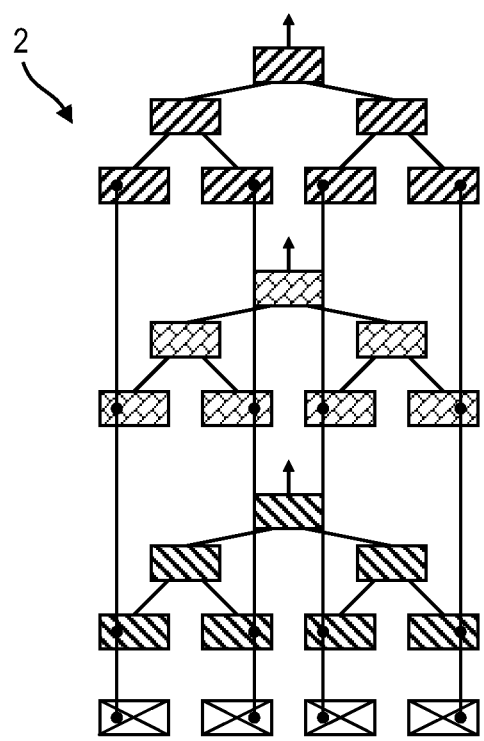
FIG. 1 is a pictorial representation of an exemplary circuit structure which is to be placed in a layout of an integrated circuit design, the circuit structure having four datapaths.
Figure 2:
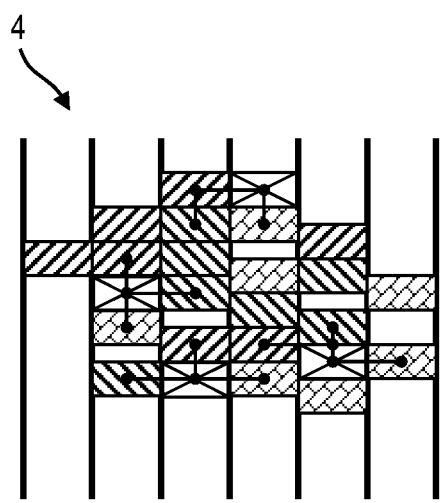
FIG. 2 is a plan view of a layout for the circuit structure of FIG. 1 generated by a conventional automated placement tool.

For a graphic example of how the present invention improves datapath alignment, consider the circuit structure 2 illustrated in FIG. 1 which resulted in the poor datapath alignment seen in FIG. 2 using conventional placement. If the present invention were applied to the same circuit structure 2 as hereinbefore explained, the result would be a much improved layout 100 depicted in FIG. 8. Layout 100 arises from the three placement sets previously mentioned (each placement set having seven cells), with two tiers defined for each of those three placement sets. Layout 100 not only has excellent datapath alignment, it is further more compact in terms of overall cluster rows and height (4×7 versus 6×7 for the prior art layout 4 of FIG. 2).

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, while the invention contemplates defining multiple clusters in a large netlist, the cluster could comprise all cells in the netlist, i.e., the entire circuit could be considered one giant cluster. It is therefore contemplated that such modifications can be made without departing from the spirit or scope of the present invention as defined in the appended claims.

What is claimed is:

1. A computer-implemented method of placing cells in a layout for an integrated circuit design, comprising:
receiving a circuit description for the integrated circuit design which includes a plurality of cells interconnected to form a plurality of nets, the cells having locations from a previous placement, by executing first instructions in a computer system;
identifying at least one cluster of the cells forming datapath logic, by executing second instructions in the computer system;
determining a datapath width for the cluster, by executing third instructions in the computer system;
identifying at least one placement set of cells in the cluster, by executing fourth instructions in the computer system;
defining a plurality of tiers in the placement set based on connectivity of the cells in the placement set, by executing fifth instructions in the computer system;
selectively assigning the cells in the placement set to the tiers constrained by the datapath width, by executing sixth instructions in the computer system; and
ordering cells within each tier, by executing seventh instructions in the computer system.

2. The method of claim 1 wherein said selectively assigning the cells includes K-means clustering of the cells.

3. The method of claim 1 wherein said determining the datapath width includes computing a size of a bounding box for cells in the cluster according to locations of the cells in the previous placement.

4. The method of claim 1 wherein said identifying the at least one placement set includes a breadth-first search beginning with input cells for the cluster.

5. The method of claim 1 wherein said defining the plurality of tiers includes logic depth assignment of cells in the placement set to define an initial number of the tiers.

6. The method of claim 1 wherein said selectively assigning the cells includes pulling a cell from a next higher tier into a current tier to fill an empty location in the current tier, wherein the cell from the next higher tier has a greatest number of interconnections with the current tier among all cells in the next higher tier.

7. The method of claim 1 wherein said ordering the cells within each tier includes greedy cell assignment according to a wirelength cost function based on locations of the cells in the previous placement.

8. The method of claim 1, further comprising:
computing congestion information for the cluster after said ordering cells in each tier;
determining that the cluster has unacceptable congestion based on the congestion information;
applying spreading constraints to cells in the cluster responsive to the unacceptable congestion; and
repeating said defining the plurality of tiers in the placement set, said selectively assigning the cells in the placement set to the tiers, and said ordering cells within each tier, subject to the spreading constraints.

9. A computer system comprising:
one or more processors which process program instructions;
a memory device connected to said one or more processors; and
program instructions residing in said memory device for placing cells in a layout of an integrated circuit design by receiving a circuit description for the integrated circuit design which includes a plurality of cells interconnected to form a plurality of nets wherein the cells have locations from a previous placement, identifying at least one cluster of the cells forming datapath logic, determining a datapath width for the cluster, identifying at least one placement set of cells in the cluster, defining a plurality of tiers in the placement set based on connectivity of the cells in the placement set, selectively assigning the cells in the placement set to the tiers constrained by the datapath width, and ordering cells within each tier.

10. The computer system of claim 9 wherein said selectively assigning the cells includes K-means clustering of the cells.

11. The computer system of claim 9 wherein said determining the datapath width includes computing a size of a bounding box for cells in the cluster according to locations of the cells in the previous placement.

12. The computer system of claim 9 wherein said identifying the at least one placement set includes a breadth-first search beginning with input cells for the cluster.

13. The computer system of claim 9 wherein said defining the plurality of tiers includes logic depth assignment of cells in the placement set to define an initial number of the tiers.

14. The computer system of claim 9 wherein said selectively assigning the cells includes pulling a cell from a next higher tier into a current tier to fill an empty location in the current tier, wherein the cell from the next higher tier has a greatest number of interconnections with the current tier among all cells in the next higher tier.

15. The computer system of claim 9 wherein said ordering the cells within each tier includes greedy cell assignment according to a wirelength cost function based on locations of the cells in the previous placement.

16. The computer system of claim 9 wherein said program instructions further compute congestion information for the cluster after said ordering cells in each tier, determine that the cluster has unacceptable congestion based on the congestion information, apply spreading constraints to cells in the cluster responsive to the unacceptable congestion, and repeat said defining the plurality of tiers in the placement set, said selectively assigning the cells in the placement set to the tiers, and said ordering cells within each tier, subject to the spreading constraints.

17. A computer program product comprising:
a computer-readable storage medium; and
program instructions residing in said storage medium for designing a layout of an integrated circuit by receiving a circuit description for the integrated circuit design which includes a plurality of cells interconnected to form a plurality of nets, the cells having locations from a previous placement, identifying at least one cluster of the cells forming datapath logic, determining a datapath width for the cluster, identifying at least one placement set of cells in the cluster, defining a plurality of tiers in the placement set based on connectivity of the cells in the placement set, selectively assigning the cells in the placement set to the tiers constrained by the datapath width, and ordering cells within each tier.

18. The computer program product of claim 17 wherein said selectively assigning the cells includes K-means clustering of the cells.

19. The computer program product of claim 17 wherein said determining the datapath width includes computing a size of a bounding box for cells in the cluster according to locations of the cells in the previous placement.

20. The computer program product of claim 17 wherein said identifying the at least one placement set includes a breadth-first search beginning with input cells for the cluster.

21. The computer program product of claim 17 wherein said defining the plurality of tiers includes logic depth assignment of cells in the placement set to define an initial number of the tiers.

22. The computer program product of claim 17 wherein said selectively assigning the cells includes pulling a cell from a next higher tier into a current tier to fill an empty location in the current tier, wherein the cell from the next higher tier has a greatest number of interconnections with the current tier among all cells in the next higher tier.

23. The computer program product of claim 17 wherein said ordering the cells within each tier includes greedy cell assignment according to a wirelength cost function based on locations of the cells in the previous placement.

24. The computer program product of claim 17 wherein said program instructions further compute congestion information for the cluster after said ordering cells in each tier, determine that the cluster has unacceptable congestion based on the congestion information, apply spreading constraints to cells in the cluster responsive to the unacceptable congestion, and repeat said defining the plurality of tiers in the placement set, said selectively assigning the cells in the placement set to the tiers, and said ordering cells within each tier, subject to the spreading constraints.

25. In an electronic design automation tool residing in a memory device of a computer system which places cells of an integrated circuit design in a layout area using wirelength optimization, the improvement comprising:
defining a plurality of tiers of the layout area for a placement set of a cell cluster based on connectivity of cells in the placement set, by executing first instructions in the computer system;
selectively assigning the cells in the placement set to the tiers constrained by a datapath width of the cell cluster, by executing second instructions in the computer system; and
ordering cells within each tier according to a wirelength cost function based on locations of the cells, by executing third instructions in the computer system.

* * * * *